US006377037B1

(12) United States Patent
Burns et al.

(10) Patent No.: US 6,377,037 B1
(45) Date of Patent: Apr. 23, 2002

(54) WATT-HOUR METER WITH DIGITAL PER-PHASE POWER FACTOR COMPENSATION

(75) Inventors: Gordon R. Burns, West Lafayette, IN (US); Javier Adame, Walchwil (CH); John T. Voisine; John P. Junker, both of Lafayette, IN (US); Jeff Kotowski, Nevada City; Richard D. Davis, Aliso Viejo, both of CA (US)

(73) Assignee: Siemens Power Transmission and Distribution, Inc., Wendell, NC (US)

( * ) Notice: Subject to any disclaimer, the term of this patent is extended or adjusted under 35 U.S.C. 154(b) by 0 days.

(21) Appl. No.: 08/904,706

(22) Filed: Aug. 1, 1997

(Under 37 CFR 1.47)

Related U.S. Application Data

(60) Provisional application No. 60/022,961, filed on Aug. 1, 1996, and provisional application No. 60/048,985, filed on Jun. 9, 1997.

(51) Int. Cl.[7] ............................................... G01R 21/06
(52) U.S. Cl. ......................... 324/142; 324/107; 702/61
(58) Field of Search ............................... 324/142, 107, 324/130, 141; 702/60, 61

(56) References Cited

U.S. PATENT DOCUMENTS

| | | | | |
|---|---|---|---|---|
| 4,837,504 A | | 6/1989 | Baer et al. ................... 324/142 |
| 4,922,189 A | * | 5/1990 | Dunn et al. ................... 324/142 |
| 5,017,860 A | | 5/1991 | Germer et al. ............... 324/142 |
| 5,122,735 A | | 6/1992 | Porter et al. ................ 324/142 |
| 5,231,347 A | | 7/1993 | Voisine et al. ............... 324/142 |
| 5,301,121 A | * | 4/1994 | Garverick et al. ............. 702/60 |
| 5,485,393 A | * | 1/1996 | Bradford ..................... 324/142 |
| 5,514,958 A | | 5/1996 | Germer ........................ 324/74 |
| 5,537,029 A | | 7/1996 | Hemminger et al. ......... 324/142 |
| 5,544,089 A | | 8/1996 | Hemminger et al. ......... 364/492 |
| 5,561,660 A | | 10/1996 | Kotowski et al. .............. 370/12 |
| 5,563,506 A | | 10/1996 | Fielden et al. ................ 324/142 |
| 5,621,629 A | | 4/1997 | Hemminger et al. .......... 363/56 |
| 5,631,554 A | | 5/1997 | Briese et al. ............. 324/76.77 |
| 5,701,253 A | * | 12/1997 | Mayell et al. ............... 324/142 |
| 5,764,523 A | * | 6/1998 | Yoshinaga et al. .......... 324/142 |

FOREIGN PATENT DOCUMENTS

| | | | |
|---|---|---|---|
| EP | 634662 | * | 1/1995 |
| WO | WO 94/16334 | * | 7/1994 |

* cited by examiner

Primary Examiner—Ernest Karlsen

(57) ABSTRACT

A watt-hour meter employs a power factor compensation technique that inserts a delay into the digitized current or voltage sample stream. An exemplary embodiment of the present invention includes an electronic watt-hour meter comprising a voltage sensor, a current sensor, a conversion circuit, and a processing circuit: The voltage sensor generates a voltage measurement signal responsive to a voltage provided to a load. Similarly, the current sensor generates a current measurement signal responsive to a current provided to a load. The conversion circuit further comprises: a first converter connected to the voltage sensor for generating sampled voltage data stream based on said voltage measurement signal; a second converter connected to the current sensor for generating a sampled current data stream based on said current measurement signal, and a phase correction circuit. The phase correction circuit is connected to one of the first and second converters and inserts a delay into one of the sampled voltage data stream or the sampled current data stream. The processing circuit is operably connected to the first and second converters, and receives information indicative of the sampled voltage data stream and sampled current data stream subject to any delay inserted by the phase correction circuit. The processing circuit then generates power consumption data from the sampled voltage data and sampled current data.

20 Claims, 3 Drawing Sheets

WATT-HOUR METER WITH DIGITAL PER-PHASE POWER FACTOR COMPENSATION

CROSS REFERENCE TO RELATED APPLICATIONS

This application claims the benefit of U.S. Provisional Patent Application Ser. No. 60/022,961, filed Aug. 1, 1996, and U.S. Provisional Patent Application Ser. No. 60/048,985, filed Jun. 9, 1997.

FIELD OF THE INVENTION

The present invention relates generally to the field of electrical utility meters, and particularly, to electrical utility meters that incorporate digital electronics.

BACKGROUND OF THE INVENTION

Electrical utility meters, or watt-hour meters, measure electrical energy consumed by a facility. Electrical utility service providers, or simply utilities, employ watt-hour meters to gather energy consumption data for customer billing and other purposes. A common form of watt-hour meter is an electronic watt-hour meter. An electronic watt-hour meter measures electrical energy consumption by sampling scaled-down versions of the voltage and current waveforms on the power lines of a facility and then performing energy consumption calculations using the sampled waveforms.

One problem encountered by electronic watt-hour meters is related to the tolerances of the meter's voltage and current sensor circuitry. The voltage and current sensor circuitry typically consists of a set of current sensors and voltage sensors that obtain signals representative of the voltage and current waveforms on the power lines, and provide scaled-down versions of those waveforms to the digital sampling circuitry. A common type of voltage sensor is a voltage divider circuit. The input to the voltage divider is connected across the power lines and the divided output of the voltage divider is connected to the digital sampling circuitry. In this manner, the digital sampling circuitry receives a suitably scaled down version of the voltage waveform. A common type of current sensor is a current transformer that comprises a toroid having a donut-shaped core. The load current, or in other words, the current consumed by the customer's facility, is generally routed through the center of the toroid, which causes a scaled-down version of the load current to appear on the current transformer winding.

Both voltage dividers and current transformers, as well as other voltage and current sensor circuitry, are subject to substantial performance variation from unit to unit. For example, while one current transformer may produce an output rms current of 2.2 milliamperes for a load current of 10 amperes, another current transformer may produce an output rms current of 2.5 milliamperes for the same load current. Such performance variation can undesirably introduce large error in the meter's energy consumption measurement. In particular, performance variation of the sensor devices causes both magnitude and phase angle errors in the resulting sampled waveforms, both of which contribute to error in the energy consumption measurement.

In order to improve measurement accuracy, electronic watt-hour meters are typically calibrated during manufacture to compensate for, among other things, the performance variation of the sensor devices. The calibration process produces consistent and accurate watt-hour meters. Calibration for magnitude variation of the sensor devices is a relatively straightforward and may be accomplished in a number of ways. For example, each sample of the sampled voltage waveform may be multiplied by a calibration constant, which effectively adjusts the measured magnitude.

Phase angle error in voltage and current magnitude signals is often referred to as power factor error, because the phase angle of primary interest is the phase angle between the voltage measurement signal and the current measurement signal. When that phase angle is inaccurate, the power factor, or in other words, the cosine of the angle between the measured voltage and current, is inaccurate. Inaccurate power factor substantially reduces the accuracy of the meter.

Accordingly, it is important that meters be calibrated to account for power factor errors introduced by the meter sensor devices. Calibration for phase error in the sensor devices have been accomplished using a variety of techniques. Such various methods include the selective introduction of impedance devices into the analog measurement signal stream. The impedance devices are typically connected to the output of the current sensor circuitry. So connected, the impedance devices introduce a calibrating phase delay into the analog current measurement signal produced by the current sensor circuitry. One drawback to the use of impedance devices is that the incorporation of the required amount of impedance devices to provide an acceptable range of compensation increases the packaging cost of the meter significantly.

U.S. Pat. No. 5,017,860 to Germer et al. describes another type of power factor correction circuit that addresses the packaging cost issue by implementing the correction circuit in the digital portion of the meter. The Germer et al. device corrects power factor by altering the sampling time of either the voltage or current signals to introduce a desired phase delay. In particular, the A/D converter of the Germer et al. device samples the analog current signal at a rate of 34 KHz. The time period of each sample is then subdivided into twelve equal sub-intervals. The phase delay is accomplished by digitizing or sampling the analog waveform at select one of the twelve subintervals. Thus, if a relatively large phase delay is required, each sample may represent the digitized analog waveform from the first or second sub-interval of the sampling period. If, however, no phase delay is required, then each sample may represent the digitized analog waveform from the twelfth sub-interval in the sampling period.

The power factor adjustment in Germer et al. has several drawbacks that limit its usefulness. First, it relies on old and limited A/D conversion technology. Specifically, the Germer et al. device employs a successive approximation A/D converter, which has performance limitations. Specifically, the cost of successive approximation A/D converters for a particular sampling rate and resolution exceeds the cost achieving similar results using newer A/D conversion technology, such as sigma delta A/D conversion technology. Accordingly, the Germer et al. power factor adjustment method is tied to outdated and cost ineffective technology.

Second, the Germer et al. device performs only a single adjustment for a polyphase meter. In other words, if the meter is connected to a three phase power system, all three phases receive the same power factor adjustment. Accordingly, the Germer et al. power factor adjustment does not adequately address per phase power factor errors, which commonly exist when a separate current sensor is used for each phase.

Another drawback to the above calibration techniques arises from the fact that the calibration is often line frequency specific. Because revenue meters operate on power lines, which generally have a constant frequency, the phase angle calibration amount is typically selected to calibrate the meter for proper performance at a single line frequency. In the United States, for example, meters are calibrated to provide accurate readings at 60 Hz. Other countries, however, utilize other line frequencies, such as 50 Hz. Because power factor error can vary with frequency, a meter that has been calibrated at 60 Hz may have degraded accuracy at 50 Hz.

This drawback therefore requires that meters be separately calibrated based on the geographical area in which they are to be used. If a meter is intended for use in a country that employs a 60 Hz line frequency, then it must be calibrated specifically for that frequency. Likewise, meters intended for use in countries employing a 50 Hz line frequency must be separately calibrated. The requirement of separately calibrated meters for different applications adds complexity in manufacturing, shipping and inventory control.

Accordingly, there exist a need for a power factor adjustment method that not only avoids the problems associated with introducing impedance devices into the analog signal stream, but also is not limited to use with outdated A/D conversion technology. There is a further need for such a power factor adjustment method that separately performs an adjustment for each phase of a polyphase meter. In addition, there is a need for a power factor adjustment technique that is compatible with different line frequencies.

SUMMARY OF THE INVENTION

The present invention fulfills the above stated needs, as well as others, by providing a meter having a power factor compensation technique that inserts a delay into the digitized current or voltage sample stream. That power factor compensation technique of the present invention is compatible with a wide variety of A/D conversion technologies. Moreover, the power factor compensation technique is operable to provide or separate amount of calibration adjustment for each phase of the meter.

An exemplary embodiment of the present invention includes an electronic watt-hour meter comprising a voltage sensor, a current sensor, a conversion circuit, and a processing circuit: The voltage sensor generates a voltage measurement signal responsive to a voltage provided to a load. Similarly, the current sensor generates a current measurement signal responsive to a current provided to a load. The conversion circuit further comprises: a first converter connected to the voltage sensor for generating sampled voltage data stream based on said voltage measurement signal; a second converter connected to the current sensor for generating a sampled current data stream based on said current measurement signal, and a phase correction circuit. The phase correction circuit is connected to one of the first and second converters and inserts a delay into one of the sampled voltage data stream or the sampled current data stream. The processing circuit is operably connected to the first and second converters, and receives information indicative of the sampled voltage data stream and sampled current data stream subject to any delay inserted by the phase correction circuit. The processing circuit then generates power consumption data from the sampled voltage data and sampled current data.

According to one embodiment of the present invention, the first and second converters are sigma delta converters. In such an embodiment, the phase correction circuit inserts the delay into the sampled data stream of one of the sigma delta converters. Accordingly, the power factor compensation technique described above allows the meter to benefit from the advantages of sigma delta conversion technology. In addition, the present invention eliminates the need for separately calibrated meters by providing a meter that optionally self-adjusts its calibration if the line frequency in which it is installed differs from the line frequency for which it was calibrated. For example, if a meter calibrated on a 60 Hz line is installed into a location that has a 50 Hz line frequency, the meter alters its calibration such that it is properly allocated for a 50 Hz line.

The above described features and advantages, as well as others, will become more readily apparent to those of ordinary skill in the art by reference to the following detailed description and accompanying drawings.

DETAILED DESCRIPTION

Figure 1:
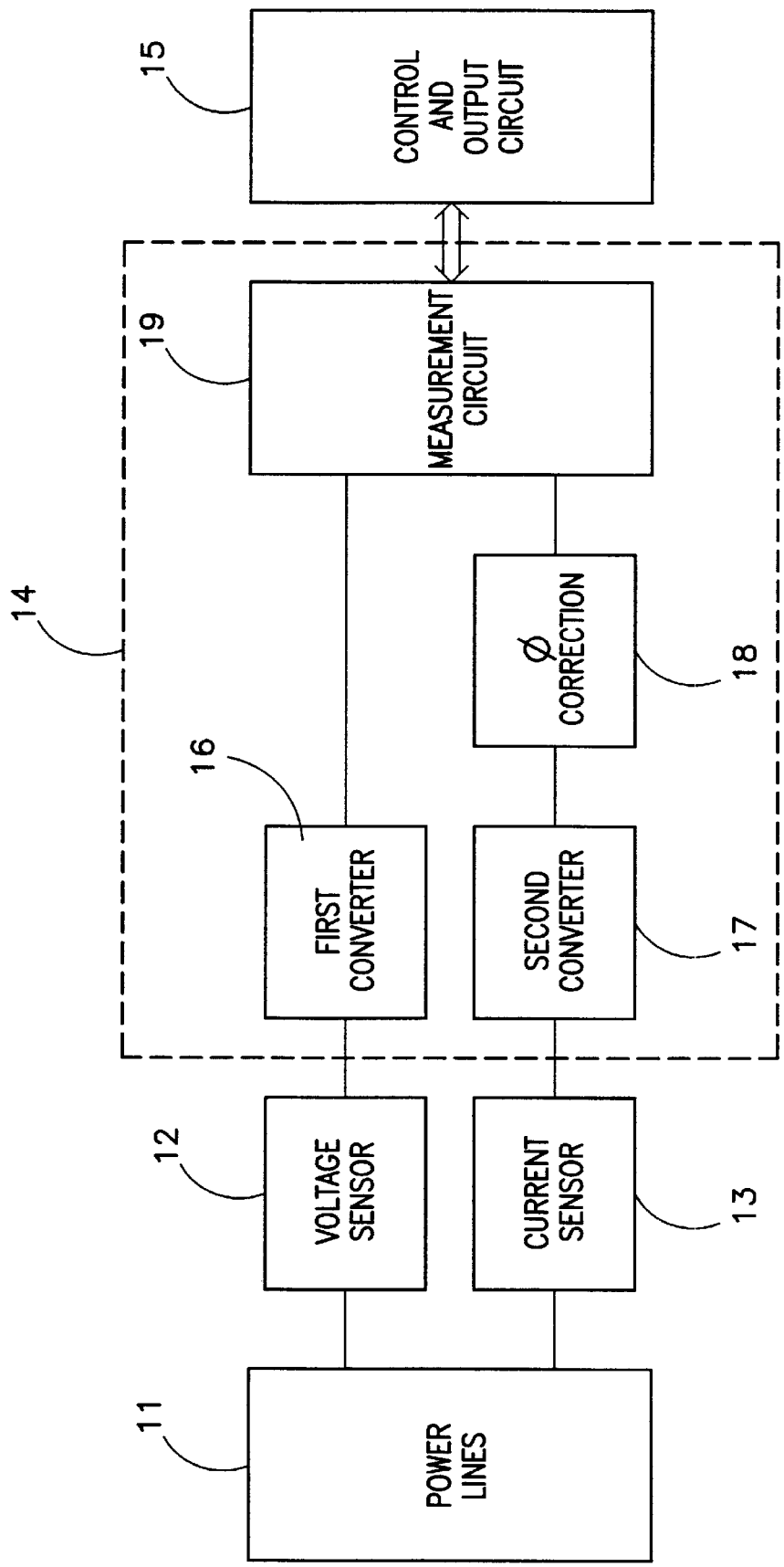
FIG. 1 shows a block diagram overview of an electrical utility meter according to the present invention connected to power lines of a facility being metered.

FIG. 1 shows a simplified block diagram of an electrical utility meter according to the present invention. In general, the meter 10 of FIG. 1 is operably connected to the power lines 11 of a power consuming facility, not shown, such as a residence or industrial establishment. In the first embodiment of the present invention, the power lines 11 comprise a three phase power line that connects the electric utility, not shown, to the power consuming facility.

The meter 10 includes a voltage sensor 12, a current sensor 13, a conversion circuit 14, and a processing and communication circuit 15. The voltage sensor 12 is connected to the power lines 11 and is operable generate a voltage measurement signal representative of the voltage waveform thereon. In the first embodiment of the present invention, the voltage sensor 12 is polyphase voltage sensor, an example of which is described below in connection with FIG. 2. The current sensor 13 is also connected to the power lines 11 and is operable to generate current measurement signals representative of the current waveform on the power lines 11. In the first embodiment of the present invention, the current sensor is a polyphase current sensor, which may suitably comprise a plurality of single phase current sensors. An example of a suitable polyphase current sensor is described below in connection with FIG. 2.

The conversion circuit 14 comprises a first converter 16, a second converter 17, a phase correction circuit 18, and a power calculation circuit 19. The first converter 16 is operably connected to the voltage sensor 12 to receive the voltage measurement signal therefrom. The first converter 16 is a device, such as an analog to digital ("A/D") converter, that generates a sampled voltage measurement data stream comprising a plurality of voltage measurement samples based on the voltage measurement signal provided by the voltage sensor 12. The first converter 16 is further operably connected to provide the plurality of voltage measurement samples to the power calculation circuit 19.

The second converter 17 is operably connected to the current sensor 13 to receive current measurement signals therefrom. The second converter 17 is also a A/D converter or other similar device that generates a sampled data stream based an input analog signal. In particular, the second converter generates a sampled current measurement data stream comprising a plurality of current measurement samples based on the current measurement signal.

The second converter 17 is operably connected to provide the current measurement samples to the phase correction circuit 18. The phase correction circuit 18 is a circuit that is operable to insert a delay into sampled current data stream in order to compensate for phase or power factor errors introduced by components of the meter. For example, the current sensors used in the meter 10 may introduce a significant amount of phase error into the current measurement signal. The phase correction circuit 18 operates to reduce the power measurement inaccuracies resulting from the phase error. The phase correction circuit 18 preferably introduces delay in an amount that is programmed into the meter 10 during calibration of the meter 10. Preferably, the phase correction circuit 18 introduces an amount of delay that is specific for the power line phase and for the line frequency. The delay insertion provided by the phase correction circuit 18 and the effect of the delay on the phase or power factor error is discussed further below.

The power calculation circuit 19 is a circuit that is operable to receive information indicative of the sampled voltage measurement data and sampled current measurement data and generate power consumption information therefrom. The power calculation circuit 19 may suitably be a digital signal processor configured to receive the voltage and current measurement samples, and multiply those samples, and accumulate the results of those multiplications over time to obtain energy consumption data. The multiplication of voltage measurement samples by the current measurement samples yields power measured in watts. However, to provide an accurate power measurement, each voltage measurement sampled must be multiplied by the current measurement sample that was generated at the same time. The sum of the power calculation products over time provides energy consumption measured in watt-hours.

The delay introduced in the current measurement data stream affects the power calculation by changing the phase of the current measurement data stream with respect to the voltage measurement data stream. Specifically, if two signals have a certain phase relationship and one of the signals is delayed, then the phase relationship between the two signals changes. Accordingly, the phase correction circuit 18 compensates for phase errors by introducing a delay, and thus a phase adjustment, into the current measurement data stream. It will noted that the phase correction circuit may alternatively be connected between the first converter 16 to provide a phase adjustment to the sampled voltage measurement data stream.

In any event, the power calculation circuit 19 is also operably connected to provide the energy consumption to the processing and communication circuit 15.

The processing and communication circuit 15 is a circuit operable to receive the energy consumption data and, among other things, communicate information indicative of energy consumption to an external device or a human technician. To this end, the processing and communication circuit 15 may include a display device and/or remote or local communication devices. Typically, the processing and communication circuit 15 includes a processor or microcontroller that performs additional processing on the energy consumption data, and also may control aspects of the operation of the components of the conversion circuit 14.

Figure 2:
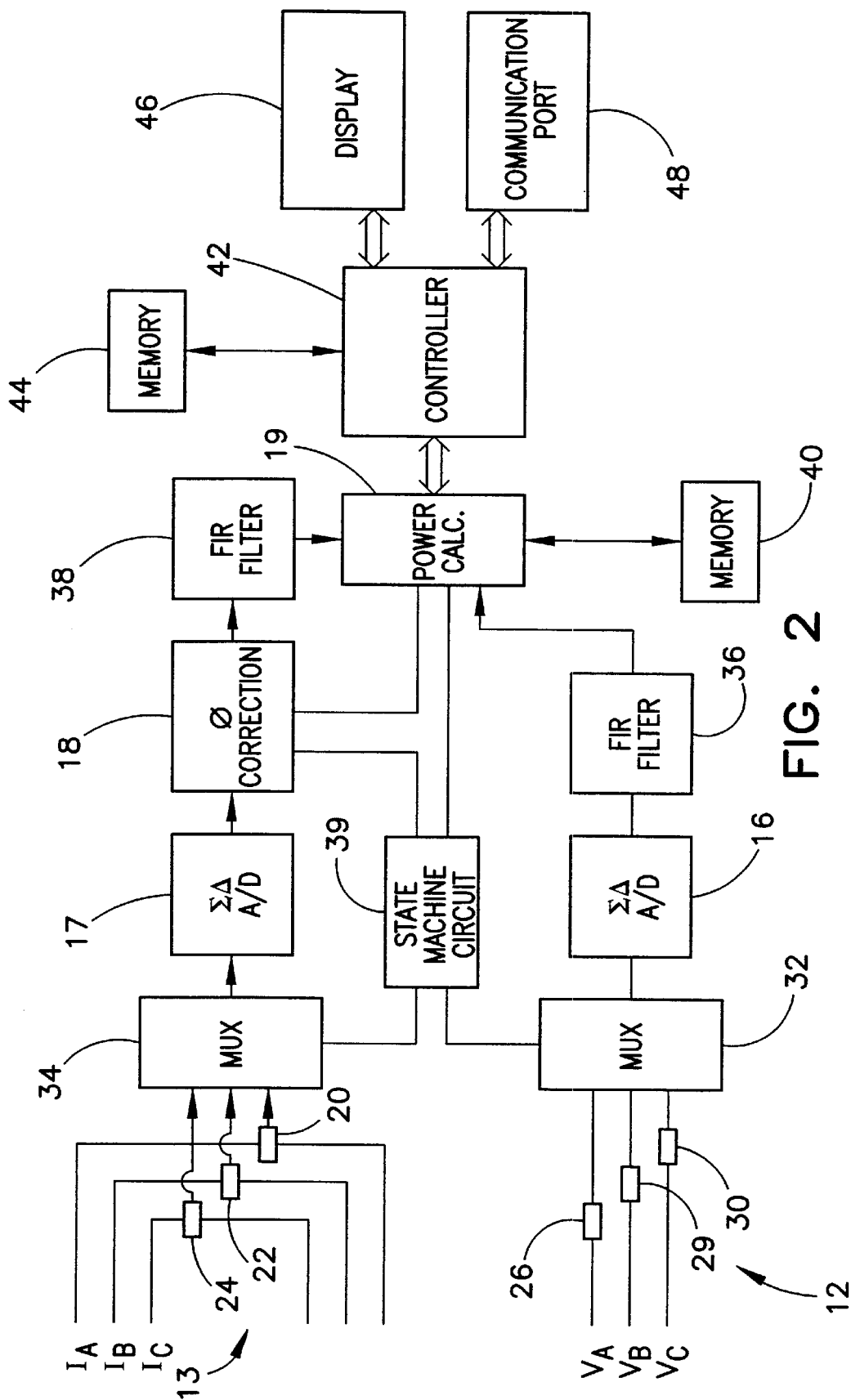
FIG. 2 shows a more detailed block diagram of an exemplary embodiment of an electrical utility meter according to the present invention.

FIG. 2 shows a more detailed block diagram of a first embodiment of the electrical utility meter 10 of FIG. 1. The first embodiment of the meter 10 is intended for use in metering a three phase electrical system in a four wire wye configuration. For purposes of clarity, like components of FIGS. 1 and 2 are identified by the same reference numbers. In the first embodiment of the meter 10, the voltage sensor 12 comprises a polyphase voltage sensor, and more particularly, a phase A voltage sensor 26, a phase B voltage sensor 28, and a phase C voltage sensor 30. Similarly, the current sensor 13 comprises a polyphase current sensor, and more particularly, a phase A current sensor 20, a phase B current sensor 22, and a phase C current sensor 24.

The phase A voltage sensor 26 is typically connected directly to the phase A power line to obtain a voltage measurement signal therefrom. To this end, the phase A voltage sensor 26 may suitably comprise a high resistance voltage divider. The phase B voltage sensor 28 preferably has a similar structure and is similarly connected to obtain a voltage measurement signal from the phase B power line. The phase C voltage sensor 30 also has a similar structure and is connected to obtain a voltage measurement signal the phase C power line.

The phase A voltage sensor 26, the phase B voltage sensor 28, and the phase C voltage sensor 30 are each connected to one of three inputs of a first multiplexer 32. The first multiplexer 32 is preferably a 3 to 1 multiplexer. In any event, the first multiplexer 34 has an output connected to an input of the first converter 16.

The phase A current sensor 20 is operably situated detect a signal indicative of the current waveform flowing through the phase A power line. For example, the phase A current sensor 20 may suitably be a current transformer which is situated in a current sensing relationship with the phase A power line. Alternatively, the current sensor may be any other suitable current sensing device known in the art. In any event, the phase A current sensor 20 is operable to generate a phase A current measurement signal responsive to the current waveform on the phase A power line.

Similarly, the phase B current sensor 22 is operably situated to detect a signal indicative of the current waveform the phase B power line, and is furthermore operable to generate a phase B current measurement signal therefrom. Likewise, the phase C current sensor 24 is operably situated to detect a signal indicative of the current waveform on the phase C power line. The phase B current sensor 22 and the phase C current sensor 24 preferably have the same structure as the phase A current sensor 20.

The phase A current sensor 20, the phase B current sensor 22, and the phase C current sensor 24 are each connected to one of three inputs of a second multiplexer 34. Like the first multiplexer 32, the second multiplexer 34 is preferably a 3 to 1 multiplexer. The second multiplexer 34 has an output connected to an input of the second converter 17.

In the first embodiment, the first converter 16 and the second converter 17 each comprise a second order sigma delta modulator or converter connected to a first clock having a frequency of approximately 3.3 MHz. A sigma delta converter or modulator is a device that samples an analog input signal using very low resolution, and typically single-bit resolution. The resulting sampled data stream typically must be further processed by a finite impulse response filter or the like to recover a high resolution digital sample indicative of the input analog signal. To this end, the first converter 16 is connected to a first FIR filter 36 configured to convert samples received from the first converter 16 into 21-bit words at a frequency of approximately 3.3 KHz The second converter 17 is connected to a second FIR filter 38 through the phase correction circuit 18. The second FIR filter 38 is also configured to generate 21-bit words from the samples received from the second converter 17 (through the phase correction circuit 18) at a frequency of 3.3 KHz. Sigma delta converters and corresponding FIR filters for high resolution A/D conversion are well known in the art.

The phase correction circuit 18 is a circuit that is operable to introduce delay into the digital sample stream between the second converter 17 and the second FIR filter 38. The introduction of the delay causes the second FIR filter 17 to produce a 21-bit word representative of a phase-delayed version of the input sample stream.

Figure 3:
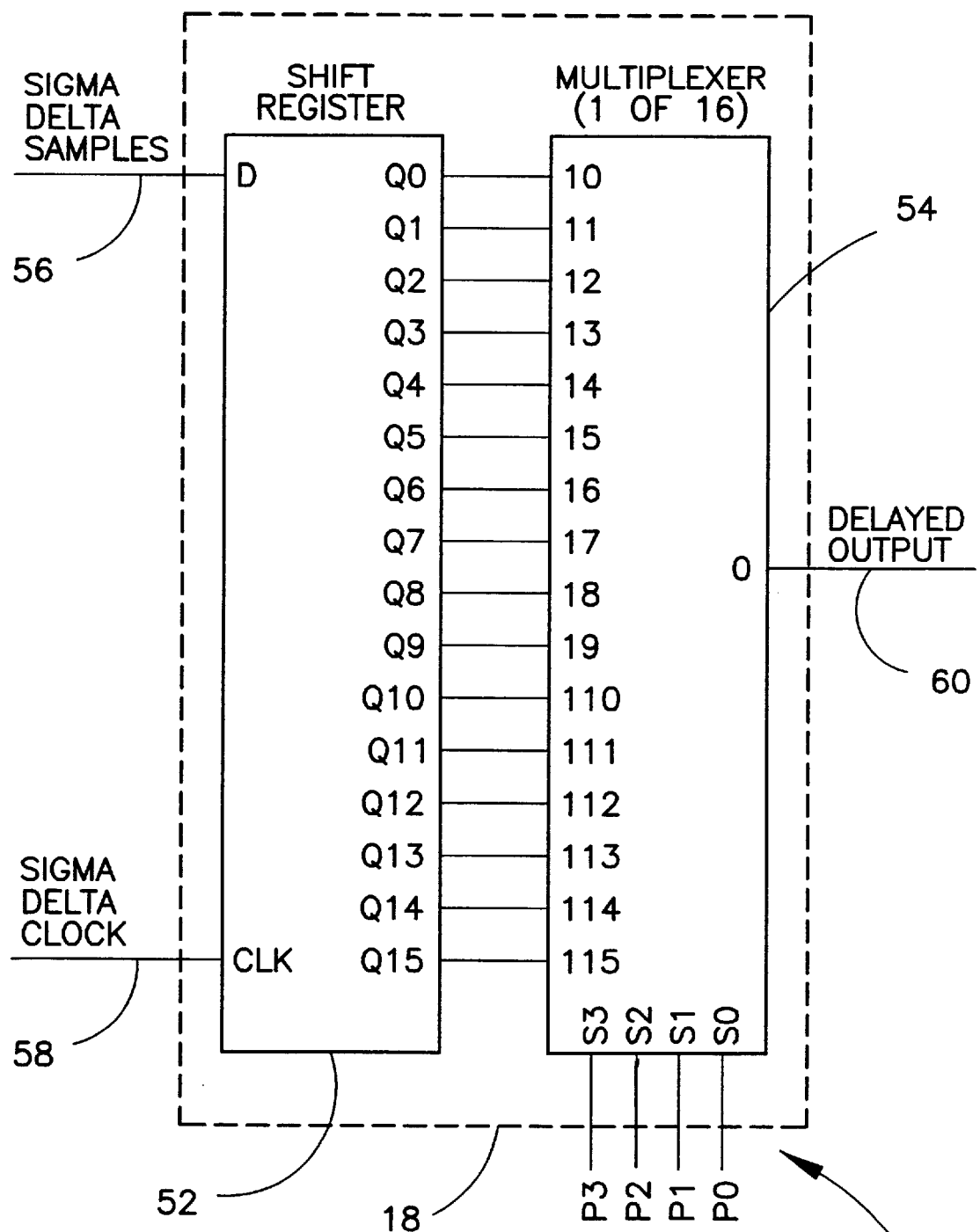
FIG. 3 shows a schematic diagram of a phase correction circuit for use in the electrical utility meter of FIG. 2.

A suitable phase correction circuit 18 is shown in FIG. 3. The phase correction circuit 18 of FIG. 3 comprises a shift register 52, a multiplexer 54, a sample input 56, a delayed sample output 60, and a delay code input 62. The sample input 56 connects the shift register 52 to the second converter 17 (FIG. 2). The shift register 52 is further connected to the multiplexer through sixteen outputs, Q0 to Q15. The clock input 58 is connected to the 3.3 Mhz clock. The multiplexer 54 is preferably a 1 of 16 multiplexer that enables one of its sixteen inputs I0 to I15 based on a four bit word received at the delay code input 62. For example, if the delay code input 62 receives a four bit word 0101, then the fifth input 15 is enabled and the remaining inputs I0–I4 and I6–I15 are disabled. The delay code input 62 is operably connected to the state machine circuit 39 (FIG. 2).

Further detail of the construction and operation of a suitable phase correction circuit for use in conjunction with a sigma delta converter may be found in U.S. Pat. No. 5,561,660, which is incorporated herein by reference.

Referring again to FIG. 2, the first FIR filter 36 and the second FIR filter 38 are each connected to the power calculation circuit 19. The power calculation circuit 19 is preferably a digital signal processing circuit that is operable to among other things, process input voltage measurement samples and current measurement samples to generate energy consumption information therefrom. The power calculation circuit 19 is operably connected to an associated memory 40, which may suitably be a random access memory.

The first and second multiplexers 32 and 34, respectively, the phase correction circuit 18, and the power calculation circuit 19 are further connected to a state machine circuit 39. The state machine circuit 39 is a digital logic circuit that is operable to control aspects of the devices to which it is connected for synchronous operation in rotations of three time slots. The three time slots correspond to the three power line phases.

The state machine circuit 39, for example, controls the multiplexers 32 and 34 by causing a different input of each multiplexer to be connected to the multiplexer output. Moreover, the state machine circuit 39 causes different control codes to be provided to the phase correction circuit 18.

These control codes, referred to as delay codes, contain information identifying the amount of delay to be introduced by the phase correction circuit 39. According to the present embodiment, a separate delay code for each phase is stored in registers within (or associated with) the state machine circuit 39. As a result, the state machine circuit 39 may include a first register, not shown, that stores the phase A delay code, a second register, not shown, that stores the phase B delay code, and a third register, not shown, that stores the phase C delay code. The delay codes are each four-bit words that specify between 0 and 15 units of delay. Thus, for example, if five units of delay are required to calibrate the phase A measurements, then the phase A delay code is 0101. During calibration of the meter 10, the phase A, phase B, and phase C delay codes are programmed to provide the appropriate power factor adjustment per phase. The details of a digital logic circuit operable to carry out the state machine control functions described above would be readily apparent to one of ordinary skill in the art.

In the first embodiment, the above described components, specifically, the first and second multiplexers 32 and 34, respectively, the first and second converters 16 and 17, respectively, the first and second FIR filters 36 and 38, respectively, the phase correction circuit 18, the power calculation circuit 19, and the associated memory 40, collectively comprise the conversion circuit 14. The components of the conversion circuit 14 may suitably be incorporated onto a single semiconductor substrate. An example of such a conversion circuit is the Power Measurement Integrated Circuit found in a model S4 electrical utility meters available from Landis & Gyr Energy Management, Inc.

The processing and communications circuit 15 includes a controller 42 connected to a non-volatile memory 44, a display 46 and a communication port 48. The controller 42 is further connected to the power calculation circuit 19. The controller 42 may suitably be a K0 series microcontroller available from NEC. The nonvolatile memory 44 is preferably an electrically erasable programmable read only memory. The controller 42 also includes firmware, or in other words, an integrated memory, into which programming instructions are stored. Alternatively, the programming instructions may be stored in the nonvolatile memory 44. The display 46 is preferably an LCD digital display or the like. The communication port 48 is a circuit operable to provide data generated by the meter 10 to a remote device using telephone lines, the power lines, or wireless communications. Such circuits are well known in the art.

In operation, the phase A, B and C current sensors 20, 22, and 24, respectively, detect the phase A current, the phase B current, and the phase C current and generate current measurement signals therefrom. The phase A current sensor provides the phase A current measurement signal to the second multiplexer 32, the phase B current sensor 22 provides the phase B current measurement signal to the second multiplexer 32, and the phase C current sensor 24 provides a phase C current measurement signal to the second multiplexer 32. Each current measurement signal typically is a signal having a voltage level that is indicative of the instantaneous current level on its respective phase. For current transformers designed for utility meter use, the current measurement signals, may for example, range from 0.0 volts to 0.3 volts maximum. Other scaling factors may of course be employed.

Contemporaneously, the phase A, B and C voltage sensors 26, 28, and 30, respectively, detect the phase A voltage, the phase B voltage, and the phase C voltage, and generate voltage measurement signals therefrom. The phase A voltage sensor 26 provides a phase A voltage measurement signal to the second multiplexer 34, the phase B voltage sensor 28 provides a phase B voltage measurement signal to the second multiplexer 34, and the phase C voltage sensor 30 provides a phase C current measurement signal to the second multiplexer 34. Each voltage measurement signal is typically a signal having a voltage level that is indicative of the instantaneous voltage level on its respective phase. In the exemplary embodiment described herein, the voltage sensors are configured to provide voltage measurement signals that range from 0.0 volts to 0.3 volts maximum. Other scaling factors may of course be employed.

The above operations of the current and voltage sensors 20, 22, 24, 26, 28, and 30 are more or less continuous and uninterrupted while the meter 10 is in operation. The operation of the conversion circuit 14, by contrast, is generally driven by the state machine circuit 39. The state machine circuit rotates through three operational states: state 0, state 1 and state 2. States 0, 1 and 2 correspond, respectively, to the processing of voltage and current measurement signals from phase A, phase B, and phase C. The state machine cycle frequency is approximate 3.3 KHz. In other words, the cycle of state 0, state 1, and state 2 all occur approximately 3300 times per second.

State 0 Operation

In state 0, the state machine circuit 39 causes the first multiplexer 32 to enable the input connected to the phase A voltage sensor 26 and causes the second multiplexer 34 to enable the input connected to the phase A current sensor 20. To this end, the state machine 39 provides suitable input enabling signals to each of the first and second multiplexers 32 and 34, respectively.

The first multiplexer 32 then provides the phase A voltage measurement signal to the first converter 16. The first converter 16 receives the phase A voltage measurement signal and generates a sampled phase A voltage measurement data stream therefrom. In the first embodiment, because the first converter 16 is a second order sigma delta converter, the first converter 16 generates one-bit resolution samples. Preferably, the first converter 16 is connected to the 3.3 Mhz clock and generates on the order of 333 samples for the duration of state 0.

The first converter 16 provides the phase A voltage measurement data stream to the first FIR filter 36. The first FIR filter 36 generates a 21-bit resolution voltage measurement word from the one-bit resolution samples of the phase A voltage measurement data stream. To this end, the first FIR filter 36 operates in a manner well known to convert one-bit sigma delta converter samples to high resolution data words. A discussion of the operation of sigma delta converters and FIR filters to perform analog to digital conversion may be found in "Sigma-Delta Conversion Technology", DSPatch, (Analog Devices, Winter, 1990). In any event, the combination of the relatively high sampling rate of the first converter 16 and the resolution provided by the first FIR filter 36 provides a combination of a higher effective sampling rate and resolution than would be achievable by a successive approximation A/D converter of similar cost.

In the present embodiment, the first FIR filter 36 receives the 333 phase A voltage measurement samples, but discards the first 45 samples and uses only the last 288 samples to generate the 21-bit phase A voltage measurement word. The reason for discarding the first 45 samples will become more readily apparent below in the description of the operation of phase correction circuit 18.

The state machine circuit 39 then causes phase A voltage measurement word to be stored in one or more registers within the first FIR filter 36, or in the alternative, the memory 40.

Contemporaneously, the second multiplexer 34 then provides the phase A current measurement signal to the second converter 17. The second converter 17 receives the phase A current measurement signal and generates a sampled phase A current measurement data stream therefrom. In the first embodiment, the second converter 17 is also a second order sigma delta converter and therefore operates in the same manner as the first converter 16. Accordingly, the second converter generates a phase A current measurement data stream consisting of approximately 333 samples of one-bit resolution for the duration of state 0. Like the first converter 16, the second converter 17 is connected to an external clock, not shown, having a frequency of on the order of 3.3 MHz.

The second converter 17 provides the phase A current measurement data stream to phase correction circuit 18. The phase correction circuit 18 further receives phase A delay code from the state machine circuit 39 during state 0. The phase correction circuit 18 then introduces a delay corresponding to the phase A delay code into the phase A current measurement data stream. According to the present embodiment, the amount of phase delay may range from 0 to 15 microseconds. The phase correction circuit 18 then provides the delayed phase A current measurement data stream to the second FIR filter 38.

Referring to FIGS. 2 and 3 contemporaneously, the phase correction circuit 18 introduces the delay in the following manner during state 0. The state machine circuit 39 provides the phase A delay code to the multiplexer 54 by causing the four-bit register containing the phase A delay code to be operably coupled to the phase delay input 62.

The shift register 52, meanwhile, receives the 333 phase A current measurement samples in serial fashion from the second multiplexer 17 through the sample input 56. The shift register 52 preferably contains 45 one-bit delay registers. Each delay register receives a bit from the data stream, holds the bit, and provides the bit to the next delay register on the next clock cycle. As a result, each delay register represents a clock cycle of delay.

The outputs Q0 to Q15 are connected to every third one-bit delay register within the shift register. Specifically, the output Q1 is connected to the third one-bit shift register, Q2 is connected to the sixth one-bit shift register, Q3 is connected to the ninth one-bit register, and so forth. The output Q0 is not connected to any delay register, but instead is connected directly to the sample input 56. As a result, the output of Q0 provides the sample stream with no delay, Q1 provides the sample stream subject to a delay of three clock cycles, Q2 provides the sample stream subject to a delay of six clock cycles, and so forth. Accordingly, based on a clock frequency of 3.3 Mhz, the Q1 provides approximately 1 microsecond of delay, Q2 provides approximately 2 microseconds of delay, and so forth.

The multiplexer 54 then enables the particular input Ix that provides the sample stream subject to an amount of delay indicated by the phase A delay code. For example, if the phase A delay code is 0101, then the input I5 is enabled where the sample stream is subject to a five microsecond delay.

The multiplexer 54 provides to the delayed sample output 60 the phase A current measurement data stream delayed by the appropriate amount of time. It will be noted that the phase correction circuit 18 of FIG. 3 is given by way of example only. Those of ordinary skill in the art may readily devise alternative devices that introduce delay into the current measurement and/or voltage measurement data stream to accomplish the power factor adjustment.

The FIR filter 38 then generates a 21-bit word based on the delayed phase A current measurement data stream. That 21-bit word represents the current magnitude for an instant in time that is delayed from the time represented by the corresponding 21-bit phase A voltage measurement word.

In particular, as discussed above, the first FIR filter 36 receives 333 samples, discards the first 45, and uses the last 288 samples to generate the 21-bit phase A voltage measurement word for state 0. In other words, only sample numbers 46 through 333 are used in the generation of the phase A voltage measurement word. Accordingly, the input analog phase A measurement signal is approximated by an A/D conversion using a time window consisting of the last 288 samples of 333 input samples.

The second FIR filter 38 also uses the last 288 samples it receives, but if delay is added by the phase correction circuit 18, then the last 288 samples received by the second FIR filter 38 are not sample numbers 46 through 333. As discussed above, the phase correction circuit 18 introduces from 0 to 15 microseconds of delay, and three pulses of the 3.3 Mhz clock occur every microsecond. Thus, for each microsecond of delay introduced, three less samples are provided to the second FIR filter 38 within the state machine cycle. Instead, the second FIR filter 38 uses sample numbers 46-X to 333-X where X is the amount of delay in clock cycles added by the phase correction circuit B.

For example, with no delay, all 333 samples reach the second FIR filter 38. As discussed above in connection with the first FIR filter 36, only the last received 288 samples are used to generate the 21-bit word. In other words, the second FIR filter 38 only uses sample numbers 46 to 333. However, with a delay amounting to, for example, 5 microseconds, the last fifteen samples, sample numbers 319 to 333, never reach the second FIR filter 38. Thus, while the second FIR filter 38 still uses the last 288 samples received to generate the 21-bit word, the last 288 samples received are sample numbers 31 to 318. The second FIR filter 38 thus uses sample numbers 31 to 318 to generate the phase A current measurement word.

The resulting delayed phase A current measurement word thus represents the current level from a time window that is delayed from the time window used to generate the phase A voltage measurement word. That delay effectively adjusts the power factor, or in other words, the phase angle between the phase A current measurement and the phase A voltage measurement.

The state machine circuit 39 then causes phase A voltage measurement word to be stored in one or more registers within the first FIR filter 36, or in the alternative, the memory 40.

State 1

In state 1, the state machine circuit 39 causes the first multiplexer 32 to enable the input connected to the phase B voltage sensor 28 and disable the input connected to the phase A voltage sensor 26. The state machine circuit 39 similarly causes the second multiplexer 34 to enable the input connected to the phase B current sensor 22 and disable the input connected to the phase A current sensor 20. To this end, the state machine 39 provides suitable input enabling signals to each of the first and second multiplexers 32 and 34, respectively.

The first multiplexer 32 then provides the phase B voltage measurement signal to the first converter 16. The first converter 16 receives the phase B voltage measurement signal and generates a sampled phase B voltage measurement data stream therefrom. The first converter 16 operates in the same manner as described above in connection with state 0. Specifically, the first converter 16 generates one-bit resolution samples, preferably on the order of 333 samples for the duration of state 1.

The first converter 16 provides the phase B voltage measurement data stream to the first FIR filter 36. The first FIR filter 36 generates a 21-bit resolution voltage measurement word from the one-bit resolution samples of the phase A voltage measurement data stream. Specifically, the first FIR filter 36 receives the 333 phase A voltage measurement samples, but discards the first 45 samples and uses only the last 288 samples to generate the 21-bit phase B voltage measurement word.

The state machine circuit 39 then causes phase B voltage measurement word to be stored in one or more registers within the first FIR filter 36, or in the alternative, the memory 40.

Contemporaneously, the second multiplexer 34 then provides the phase B current measurement signal to the second converter 17. The second converter 17 receives the phase B current measurement signal and generates a sampled phase B current measurement data stream therefrom. Specifically, the second converter generates a phase B current measurement data stream consisting of approximately 333 samples of one-bit resolution for the duration of state 1.

The second converter 17 provides the phase B current measurement data stream to phase correction circuit 18. The phase correction circuit 18 further receives phase B delay code from the state machine circuit 39 during state 1. The phase correction circuit 18 then introduces a delay corresponding to the phase B delay code into the phase B current measurement data stream. Similar to the phase delay discussed above in connection with state 0, the amount of phase delay may range from 0 to 15 microseconds, The phase correction circuit 18 then provides the delayed phase B current measurement data stream to the second FIR filter 38.

The FIR filter 38 then generates a 21-bit word based on the delayed phase B current measurement data stream. That 21-bit word represents the current magnitude for a time window that is delayed or offset from the time window that the corresponding 21 bit phase B voltage measurement word represents. That delay produces the power factor adjustment, or in other words, the phase angle adjustment between the phase B current measurement and the phase B voltage measurement The state machine circuit 39 then causes phase B voltage measurement word to be stored in one or more registers within the second FIR filter 38, or in the alternative, the memory 40.

State 2

In state 2, the state machine circuit 39 causes the first multiplexer 32 to enable the input connected to the phase C voltage sensor 30 and disable the input connected to phase B voltage sensor 28. The state machine circuit 39 similarly causes the second multiplexer 34 to enable the input connected to the phase C current sensor 24 and disable the input connected to the phase B current sensor 22. To this end, the state machine 39 provides suitable input enabling signals to each of the first and second multiplexers 32 and 34, respectively.

The first multiplexer 32 then provides the phase C voltage measurement signal to the first converter 16. The first converter 16 receives the phase C voltage measurement signal and generates a sampled phase C voltage measurement data stream therefrom. The first converter 16 operates in the same manner as described above in connection with state 0. Specifically, the first converter 16 generates one-bit resolution samples, preferably on the order of 333 samples for the duration of state 2.

The first converter 16 provides the phase C voltage measurement data stream to the first FIR filter 36. The first FIR filter 36 generates a 21-bit resolution voltage measurement word from the one-bit resolution samples of the phase C voltage measurement data stream. Specifically, the first FIR filter 36 receives the 333 phase C voltage measurement samples, but discards the first 45 samples and uses only the last 288 samples to generate the 21-bit phase C voltage measurement word.

The state machine circuit 39 then causes phase C voltage measurement word to be stored in one or more registers within the first FIR filter 36, or in the alternative, the memory 40.

Contemporaneously, the second multiplexer 34 then provides the phase C current measurement signal to the second converter 17. The second converter 17 receives the phase C current measurement signal and generates a sampled phase C current measurement data stream therefrom. Specifically, the second converter generates a phase C current measurement data stream consisting of approximately 333 samples of one-bit resolution for the duration of state 2.

The second converter 17 provides the phase C current measurement data stream to phase correction circuit 18. The phase correction circuit 18 further receives phase C delay code from the state machine circuit 39 during state 2. The phase correction circuit 18 then introduces a delay corresponding to the phase C delay code into the phase C current measurement data stream. As discussed above, the amount of phase delay may range from 0 to 15 microseconds. The phase correction circuit 18 then provides the delayed phase C current measurement data stream to the second FIR filter 38.

The FIR filter 38 then generates a 21-bit word based on the delayed phase C current measurement data stream. That 21-bit word represents the current magnitude for a time window that is delayed or offset from the time window that the corresponding 21-bit phase C voltage measurement word represents. That delay produces the power factor adjustment, or in other words, the phase angle adjustment between the phase C current measurement and the phase C voltage measurement.

The phase correction circuit 18 provides the delayed phase C current measurement data stream to the second FIR filter 38. The second FIR filter 38 generates a 21-bit resolution voltage measurement word from the one-bit resolution samples of the delayed phase C current measurement data stream. The state machine circuit 39 then causes phase C current measurement word in one or more registers within the second FIR filter 38, or in the alternative, the memory 40.

As a result, at the end of state 2, the phase A, phase B and phase C voltage measurement words are stored in registers of the first FIR filter 16 and the phase A, phase B, and phase C voltage measurement words are stored in registers within the second FIR filter 17.

The state machine circuit 39 then returns to state 0 and repeats the state machine cycle described above. Meanwhile, the power calculation circuit 19 performs the power consumption and energy consumption calculations using the voltage measurement words from the first FIR filter 36 and the current measurement words from the second FIR filter 38. The power calculation circuit 19 determines power consumption by multiplying selective pairs of the current and voltage measurement words. The resulting power consumption products are then summed over time to generate energy consumption measurements.

For example, in the exemplary embodiment of the meter described herein, the appropriate power calculation is:

$$POWER = V_A I_A + V_B I_B + V_C I_C \quad (1)$$

The power calculation circuit 19 carries out the above calculation in the manner described herebelow. The power calculation circuit 19 retrieves the phase A voltage measurement word from the first FIR filter 36, retrieves the phase A current measurement word from the second FIR filter 38, and then multiplies the two words together. The power calculation circuit 19 then retrieves the phase B voltage measurement word from the first FIR filter 36, retrieves the phase B current measurement word from the second FIR filter 38, and multiplies those words together. The resulting product is added to the product of the phase A measurement words. The power calculation circuit 19 repeats the same process to generate a product of the phase C voltage and current measurement words, which is then added to the sum of the phase A and phase B products.

The resulting sum, or energy consumption sum, is the quantity of energy consumed by all three phases of the electrical system for a discrete time period. The discrete time period is the state machine cycle period, or in other words, approximately 300 microseconds. The energy consumption sum may be scaled to yield energy consumption in units of watt-hours.

When the state machine circuit completes the next cycle, the same calculations are performed using a new set of phase A, phase B, and phase C voltage and current measurement words. The result of that calculation is added to the energy consumption sum from the previous state machine cycle. A running total of energy consumption for subsequent state machine cycles is accumulated.

From time to time, the power calculation circuit 19 provides the power consumption information to the controller 42 of the processing and communication circuit 15. The controller 42 accumulates the power consumption data until a predefined watt-hour threshold has been reached. At that point, the controller 42 generates a power consumption pulse and increments an internal power consumption counter. The power consumption counter is the number by which customer energy consumption is tracked. For example, as is well known, a utility may determine a particular customer's consumption for a particular billing cycle by subtracting the power consumption counter value at the beginning of the billing cycle from the power consumption counter value at the end of the billing cycle.

The controller 42 preferably provides the power consumption counter information to both the nonvolatile memory 44 and the display 46. The display 46 then provides a visual representation of the power consumption counter information from which readings may be taken by utility personnel. The nonvolatile memory 44 stores the power consumption counter information for the purposes of retention in the case of a power interruption.

Optionally, the processor 42 further provides the power consumption counter information, as well as other information, to the communication port 48. The communication port 48 may then communicate the information over an external communication means, such as a public telephone network, to a central processing facility for the utility. In this manner, the utility may track and bill for power consumption registered by the meter 10 without requiring an employee to physically view the meter. The processor 42 also provides overall control of the operation of the conversion circuit 14 through control signal lines, not shown.

In addition to the power measurement pulses, the power calculation circuit 19 also determines and provides other information to the controller 64. In particular, the power calculation circuit 19 provides for each phase, the measured voltage magnitude and phase angle data, and the measured current magnitude and phase angle data. The determination of such values using the phase A, phase B, and phase C voltage and current measurement words is well known. U.S. patent application Ser. No. 08/690,973, filed Aug. 1, 1996, which is assigned to the assignee of the present invention, and which is incorporated herein by reference, describes a suitable technique for generating such values. The meter 10 as described above thus employs a per phase power factor calibration technique that is compatible with sigma delta converters. The meter enjoys the benefits of digital power factor calibration while also taking advantage of the superior performance of sigma delta A/D conversion technology. The use of the per phase calibration allows each phase of a three phase meter to be precisely calculated to compensate for per phase variables in the operation of the meter's sensor circuitry.

The controller 42 is further operable to determine the line frequency of the voltage and current measurement signals.

In an alternative embodiment, the phase correction circuit 19 may be connected after the second FIR filter 38. To achieve the 1 microsecond resolution of the first embodiment however, the voltage and current measurement word frequency would have to be close to 1 Mhz. At present, an A/D converter would unduly increase the cost of the meter. Nevertheless, in the future, such an alternative may be economically viable.

In another alternative embodiment, the phase correction circuit may be employed at the output of successive approximation A/D converter, in an otherwise similar circuit. However, the successive approximation A/D converter would have to have a sampling rate of approximately 1 Mhz to achieve similar resolution as the first embodiment of the present invention. At present, a successive approximation A/D converter having such capabilities are not economically viable.

In addition to the above described capabilities, the meter 10 furthermore automatically adjusts its power factor calibration for the particular frequency of the power lines to which it is connected. To this end, the controller 42 is operable to automatically adjust the phase A, phase B, and phase C delay codes from a value specific to a first line frequency to a value specific to a second line frequency.

Calibration

The meter 10 is initially calibrated to compensate for, among other things, power factor errors. To this end, the phase A, phase B, and phase C delay codes are selected such that they provide appropriate compensation when the meter is operating at a first power line frequency.

In particular, to calibrate a meter, the meter 10 is attached to a test arrangement having a known line voltage and current with a known phase relationship. In the exemplary embodiment described herein, the line frequency is 60 Hz. Readings are taken, and are compared to expected values based on the known line voltage and current. Adjustments are then made to change the amount of delay. Specifically, the amount of delay required to achieve the appropriate power factor response is calculated and the programmed into the controller 42. The controller 42 subsequently provides the corresponding phase A, phase B, and phase C delay codes to the registers of the state machine circuit 39. Adjustments may be repeated for each phase until the measured values for each phase are sufficiently in compliance with the known line voltage and current values.

When the exemplary calibrated meter is installed in a 60 Hz facility, the meter performs normal meter operations using the phase A, phase B, and phase C delay codes as programmed during calibration. Specifically, the phase compensation circuit 19 introduces delay into the current measurement data stream pursuant to the delay codes stored in the registers of the state machine circuit 39.

However, when the exemplary calibrated meter is installed in a 50 Hz facility, the calibration is adjusted for 50 Hz line frequency operation. Specifically, the controller 42 within the meter 10 first determines that the meter 10 is connected to power lines in a 50 Hz line frequency environment. The meter 10 may suitably employ any known method to detect the line frequency.

Once it is determined that the meter 10 is connected in a 50 Hz line frequency environment, the controller 42 alters the phase A, phase B, and phase C delay codes in the registers of the state machine circuit 39. Specifically, the controller 42 adjusts the phase A delay code and phase B delay code using the equation $$DC50=1.428571(DC60)+6.142857,$$

where $DC60$ is the nominal 60 Hz delay code for either phase A or phase B, and $DC50$ is the corresponding 50 Hz delay code. The controller 42 adjusts the phase C delay code using the equation, and $$DC50=1.428571(DC60)+9.285714,$$

where $DC60$ is the nominal 60 Hz phase C delay code. The relationship for the adjustment of phase C differs in the exemplary embodiment because the phase C power line is used to power the meter 10, as is well known in the art. To power the meter, phase C is connected to a power supply within the meter, which causes additional phase distortion of the phase C measurement signals.

It is noted that although the above relationship between $CD60$ and $CD50$ is shown to be linear, the calibration values vary somewhat exponentially with line frequency. A linear equation is used because the present invention only requires two line frequency values, and a linear relationship is adequate for that purpose. If three or more line frequencies are contemplated, an appropriate exponential relationship may readily be determined by those of ordinary skill in the art.

It will also be noted that the above relationship will vary with the hardware design of the measurement system. The above values are suitable for use with a model S-4 meter available from Landis & Gyr Utilities Services, Inc. Those of ordinary skill in the art may readily determine appropriate relationships between 50 Hz delay constants and 60 Hz delay constants for their own implementations using ordinary calibration techniques. Specifically, several meters of a particular model should be calibrated at 50 Hz and 60 Hz, with their delay constants recorded for each. A relationship between the 50 Hz and 60 Hz delay constants may then be determined using the recorded sample points.

It will be appreciated that the above described embodiments are illustrative, and that those of ordinary skill in the art may readily devise their own implementations that incorporate the principles of the present invention and fall within the spirit and scope thereof.

We claim:

1. An arrangement for generating a phase correction in a measurement device, the arrangement comprising:

a phase correction circuit operable to insert a delay into one of a sampled voltage data stream and a sampled current data stream, the delay effecting a phase adjustment between the sampled voltage data stream and the sampled current data stream, the delay having a delay length based on a delay value;

a processing circuit operable to generate the delay value and provide the delay value to the phase correction circuit, the processing circuit further operable to obtain information identifying one of a plurality of line frequency values, and generate the delay value based at least in part on the obtained information.

2. The arrangement of claim 1 wherein the phase correction circuit is operable to obtain the information identifying one of the plurality of line frequency values based on a detected line frequency.

3. The arrangement of claim 1 wherein the processing circuit is further operable to generate the delay value by:

employing a calibration delay value if the identified one of the plurality of line frequency values is representative of a first line frequency;

adjusting the calibration delay value if the identified one of the plurality of line frequency values is representative of a second line frequency; and employ the adjusted calibration delay value if the identified one of the plurality of line frequency values is representative of the second line frequency.

4. The arrangement of claim 3 wherein the first line frequency is 60 Hz and the second line frequency is 50 Hz.

5. The arrangement of claim 1 wherein the phase correction circuit includes a shift register.

6. The arrangement of claim 5 wherein the phase correction circuit includes a multiplexer coupled to the shift register.

7. The arrangement of claim 1 wherein the phase correction circuit has an input adapted to be coupled to a sigma delta converter and an output adapted to be coupled to an FIR filter.

8. A method for generating a phase correction in a measurement device, the method comprising:

employing a first value as a delay value if a first line frequency is received by the measurement device;

employing a second value as a delay value if a second line frequency is received by the measurement device;

inserting a delay into one of a sampled voltage data stream and a sampled current data stream, the delay effecting a phase adjustment between the sampled voltage data stream and the sampled current data stream, the delay having a delay length based on the delay value.

9. The method of claim 8, further comprising detecting a line frequency to determine if the second line frequency is received by the measurement device.

10. The method of claim 8, further comprising performing a calibration operation to determine the first value.

11. The method of claim 10, further comprising deriving the second value from the first value.

12. The method of claim 10, further comprising deriving the second value from the first value using a linear equation.

13. The method of claim 8, further comprising deriving the second value from the first value.

14. The method of claim 8, wherein inserting the delay further comprises receiving data from a sigma delta converter and providing the data to an FIR filter after the delay.

15. The method of claim 8 wherein the first line frequency is 60 Hz and the second line frequency is 50 Hz.

16. An electronic watt-hour meter comprising:

a) a voltage sensor operable to generate a voltage measurement signal responsive to a voltage provided to a load;

b) a current sensor operable to generate a current measurement signal responsive to a current provided to a load;

c) a conversion circuit comprising a first converter connected to the voltage sensor for generating sampled voltage data stream comprising a plurality of voltage samples, based on said voltage measurement signal, a second converter connected to the current sensor for generating sampled current data stream based on said current measurement signal, and a phase correction circuit operable to insert a delay into one of a sampled voltage data stream and a sampled current data stream, the delay effecting a phase adjustment between the sampled voltage data stream and the sampled current data stream, the delay having a delay length based on a delay value;

d) a processing circuit operably connected to the first and second converters, said processing circuit operable to receive information indicative of the sampled voltage data and the sampled current data and generate power consumption data therefrom, the processing circuit further operable to obtain information identifying one of a plurality of line frequency values, generate the delay value based at least in part on the line frequency value, and provide the delay value to the phase correction circuit.

17. The arrangement of claim 16 wherein the phase correction circuit is operable to obtain the information identifying one of the plurality of line frequency values based on a detected line frequency.

18. The arrangement of claim 16 wherein the processing circuit is further operable to generate the delay value by:

employing a calibration delay value if the identified one of the plurality of line frequency values is representative of a first line frequency;

adjusting the calibration delay value if the identified one of the plurality of line frequency values is representative of a second line frequency; and employ the adjusted calibration delay value if the identified one of the plurality of line frequency values is representative of the second line frequency.

19. The arrangement of claim 16 wherein the phase correction circuit includes a multiplexer coupled to a shift register.

20. The arrangement of claim 16 wherein the phase correction circuit has an input adapted to be coupled to a sigma delta converter and an output adapted to be coupled to an FIR filter.

* * * * *